United States Patent
Cowles et al.

[11] Patent Number: 6,144,593
[45] Date of Patent: Nov. 7, 2000

[54] CIRCUIT AND METHOD FOR A MULTIPLEXED REDUNDANCY SCHEME IN A MEMORY DEVICE

[75] Inventors: Timothy B. Cowles; Victor Wong; James S. Cullum; Jeffrey P. Wright, all of Boise, Id.

[73] Assignee: Micron Technology, Inc., Boise, Id.

[21] Appl. No.: 09/387,650

[22] Filed: Sep. 1, 1999

[51] Int. Cl.[7] ........................................ G11C 7/00
[52] U.S. Cl. .................. 365/200; 365/189.02; 365/225.7
[58] Field of Search .............................. 365/200, 230.03, 365/225.7, 189.02

[56] References Cited

U.S. PATENT DOCUMENTS

| | | | |
|---|---|---|---|
| 4,660,179 | 4/1987 | Aoyama | 365/200 |
| 4,727,516 | 2/1988 | Yoshida et al. | 365/200 |
| 5,268,866 | 12/1993 | Feng et al. | 365/200 |
| 5,293,348 | 3/1994 | Abe | 365/230.03 |
| 5,349,556 | 9/1994 | Lee | 365/200 |
| 5,359,560 | 10/1994 | Suh et al. | 365/200 |
| 5,491,664 | 2/1996 | Phelan | 365/200 |
| 5,848,003 | 12/1998 | Nishikawa | 365/200 |

*Primary Examiner*—Son Mai
*Attorney, Agent, or Firm*—Dorsey & Whitney LLP

[57] ABSTRACT

A semiconductor memory device including a memory-cell array divided into a plurality of memory sub-arrays that are arranged into rows and columns of memory cells. Each of the sub-arrays have a limited number of redundant rows and columns to repair defective memory cells. The redundant memory of at least two memory sub-arrays are coupled to an I/O line through a respective isolation circuit. A control circuit coupled to the isolation circuits selectively couples the redundant memory of the sub-arrays to the I/O line. Coupling the redundant memory of multiple sub-arrays facilitates using the redundant memory of one sub-array to repair the defective memory cells in other sub-arrays also coupled to the I/O line, when the redundant memory primarily associated with the other sub-arrays have been depleted.

28 Claims, 3 Drawing Sheets

CIRCUIT AND METHOD FOR A MULTIPLEXED REDUNDANCY SCHEME IN A MEMORY DEVICE

TECHNICAL FIELD

The invention relates generally to memory devices, and more particularly to a circuit and method for replacing defective memory cells in a memory device using redundant memory cells.

BACKGROUND OF THE INVENTION

A typical semiconductor memory device includes a memory-cell array containing a plurality memory cells arranged in rows and columns. The memory cells in the array are typically tested and, if necessary, repaired before the memory devices are shipped to customers. During testing of the memory device, any of the memory cells that are found to be defective are replaced with a redundant memory cell. The entire row or column containing the defective memory cell is typically replaced with a redundant row or column, respectively. For example, to replace a row containing a defective memory cell, a row address decoder is programmed to map a redundant row to the address of the row containing the defective memory cell, and to disable data access to the row containing the defective memory cell. Therefore, when an external circuit reads data from or writes data to this defective row address, the row address decoder does not activate the defective row, but instead activates the redundant row so that data may be transferred to or from a corresponding addressed memory cell within the redundant row.

Substitution of a redundant row or column is conventionally accomplished by opening a specific combination of fuses, or closing a combination of antifuses, in one of several fuse banks on the die in which the memory device is formed. Conventional fuses include polysilicon fuses, which can be opened by laser trimming, and also include avalanche-type fuses and capacitive-type antifuses. If a given row or column in the array contains a defective memory cell, the address of that defective memory cell is programmed into the fuse bank. A compare circuit compares each incoming address to determine whether the incoming address matches any of the addresses programmed in the fuse banks. If the compare circuit determines a match, it outputs a match signal to a row or column decoder. In response, the row or column decoder accesses the appropriate redundant row or column, and ignores the defective row or column in the primary memory array.

Although it would appear that having more redundant memory for the memory device would be advantageous, the rows and columns of redundant memory cells, as well as the compare circuitry necessary for accessing the redundant rows and columns, occupy considerable space on the die of the memory device. Compare circuits typically employ multiple exclusive OR gates which require a greater amount of area than other logic gates, such as NAND and NOR gates. At least one compare circuit is required for each bank of fuses. On the other hand, reducing the number of redundant rows and columns may result in an insufficient number of redundant rows and columns to repair the memory device.

Exacerbating the problem with reducing the number of redundant memory elements is the fact that the primary memory array is divided into several sub-arrays. Conventional memory devices divide the primary array of memory cells into sub-arrays so that only a portion of the memory need be energized during a given access. This results in significant power reduction. However, the problem is that within each sub-array, there are a limited number of redundant rows and columns available to repair the defective memory cells located in the sub-array. The associated redundant rows and columns can be used only to repair defective memory cells located within the particular sub-array, or group of sub-arrays. If there are more defective memory cells in a sub-array than can be repaired by the redundant memory available in that sub-array, the entire memory device must be discarded.

There is a need for increasing the repairability of a memory device by replacing defective memory cells with redundant memory while minimizing any increase in the amount of redundant memory in the memory device.

SUMMARY OF THE INVENTION

A memory device having a memory cell array divided into several memory sub-arrays maps unused redundant memory of one memory sub-array to repair defective memory in another memory sub-array in order to increase memory repairability without increasing the number of redundant rows or columns. Each sub-array has a limited number of redundant memory. When the limited number of redundant memory is depleted for a memory sub-array, the memory device can still be repaired by mapping unused redundant memory of another memory sub-array to the address of the defective memory cell. The sub-arrays sharing unused redundant memory are coupled through a respective isolation circuit to common I/O lines. A control circuit is coupled to the isolation circuit to selectively couple the redundant memory to the appropriate I/O line and facilitate the use of the redundant memory of one memory sub-array to repair defective memory of another memory sub-array. The substitution appears transparent to the remainder of the memory device.

DETAILED DESCRIPTION OF THE INVENTION

Figure 1:
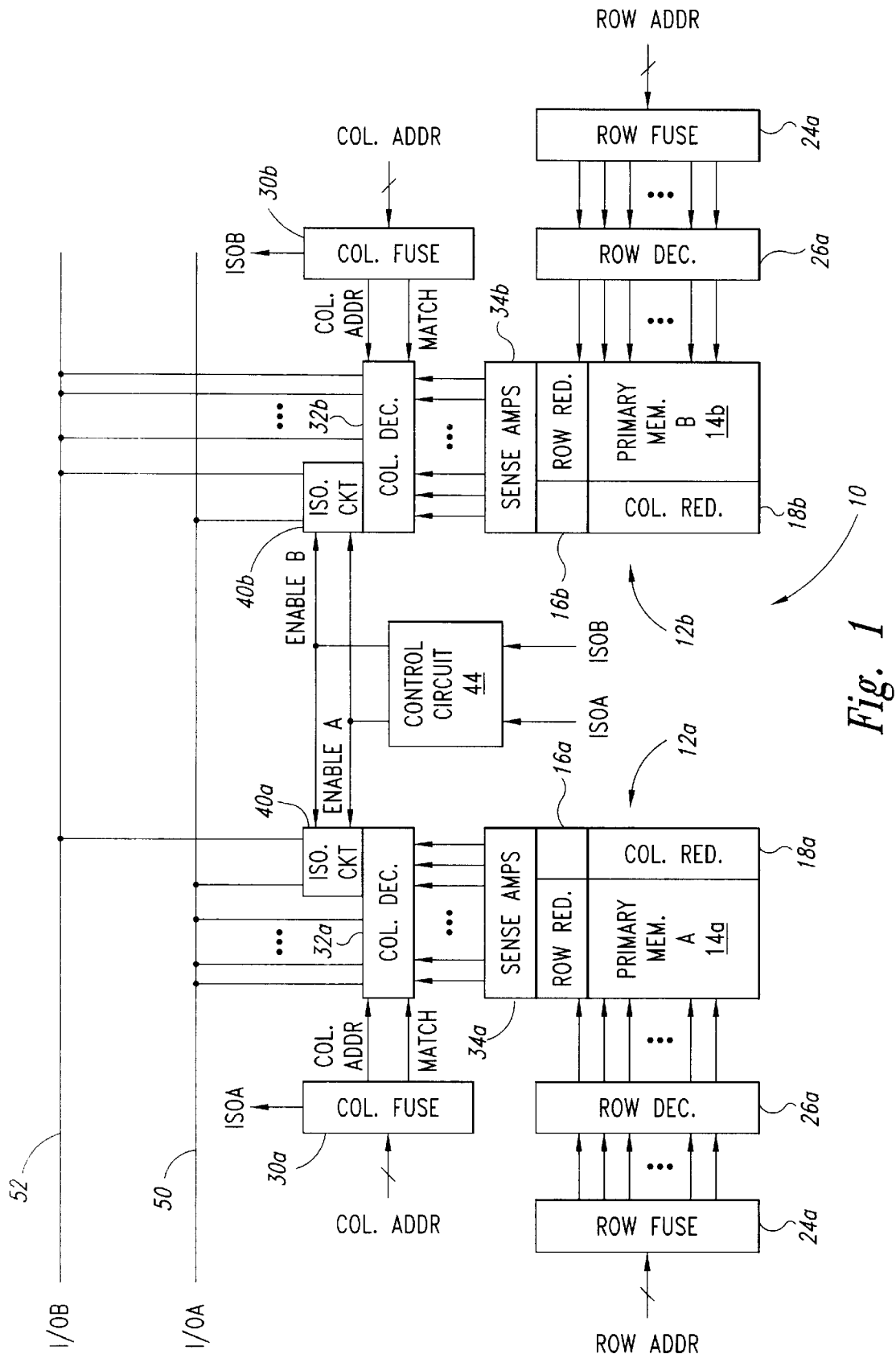
FIG. 1 is a block diagram of a portion of a memory device according to an embodiment of the present invention.

Illustrated in FIG. 1 is an embodiment of a memory device 10 according to the principles of the present invention. As mentioned above, when the number of defects that require replacement by a redundant row or column exceeds the number available in a memory sub-array, the conventional memory device cannot be repaired. However, unlike the prior art memory device, when the number of redundant rows or columns associated with a first memory sub-array have been exhausted, the memory device 10 is able to "substitute" an unused redundant row or column from another memory sub-array to repair the first memory sub-array. Thus, the memory device 10 has increased repairability without increasing the number of redundant rows or columns of each sub-array.

FIG. 1 illustrates the memory device 10 having two memory sub-arrays 12a and 12b. Each memory sub-array 12a, 12b includes a primary memory portion 14a, 14b and a redundant memory portion. The redundant memory portion is further separated into redundant row memory 16a, 16b and redundant column memory 18a, 18b. As mentioned previously, both the redundant row 16a, 16b and column 18a, 18b memory are used to repair defective memory cells in the primary memory portion 14a, 14b. The number of redundant row 16a, 16b and column 18a, 18b memory located within each memory sub-array 12a, 12b is limited.

Associated with each sub-array 12a, 12b is a row fuse bank 24a, 24b and a row address decoder 26a, 26b, as well as a column fuse bank 30a, 30b and a column address decoder 32a, 32b. Each of the row and column fuse banks include a set of programmable devices for each of the available redundant rows and columns in the respective memory sub-array. The columns of the sub-arrays 12a, 12b are coupled to a corresponding number of sense amplifiers 34a, 34b. The sense amplifiers 34a, 34b amplify the data from the columns of the respective sub-array, and have their output coupled to the respective column decoders 32a, 32b. The columns of the primary memory portion 14a are coupled through the sense amplifiers 34a and the column decoder 32a to an I/O line 50. Similarly, the columns of the primary memory portion 14b are coupled through the sense amplifiers 34b and the column decoder 32b to an I/O line 52. A person ordinarily skilled in the art will appreciate that the I/O lines 50 and 52 may be either complementary pairs of I/O lines, or single ended I/O lines.

The description of the memory device 10 has been to this point similar to a description of a conventional memory device. However, the memory device 10 includes circuitry, in addition to that found in a conventional memory device, so redundant memory of one sub-array may be shared with another sub-array. The memory device 10 further includes isolation circuits 40a and 40b coupled between the column decoders 32a and 32b and the I/O lines 50 and 52, respectively. Each isolation circuit 40a, 40b is coupled to both I/O lines 50 and 52, and will selectively couple the redundant column memory 18a, 18b to either of the I/O lines 50, 52. The memory device 10 also includes a control circuit 44 coupled to receive isolation signals ISOA and ISOB from the column fuse banks 30a, 30b, respectively. The control circuit 44 is further coupled to provide enable signals ENABLEA and ENABLEB to activate or inhibit the isolation circuits 40a, 40b to control which of the I/O lines 50, 52 will be coupled to a selected redundant column memory 18a, 18b.

As will be explained in more detail below, although the I/O line 50 is primarily associated with the sub-array 12a, and the I/O line 52 is primarily associated with the sub-array 12b, coupling the redundant column memory 18a, 18b to each of the I/O lines 50, 52 through the isolation circuits 40a, 40b facilitates using redundant memory of one sub-array to repair a defective memory cell in another.

An I/O line is said to be primarily associated with a particular memory sub-array when the I/O line is coupled to the columns of the primary memory portion of that particular sub-array. For example, as shown in FIG. 1, the I/O line 50 is primarily associated with the sub-array 14a, and the I/O line 52 is primarily associated with the sub-array 14b. In contrast, when accessing a redundant memory cell that has been mapped to an address located within another memory sub-array, the I/O lines to which the redundant memory cell will be coupled are said to be primarily associated with the other memory sub-array. An I/O line may be primarily associated with several memory sub-arrays. However, as a person ordinarily skilled in the art will appreciate, the I/O line can be receiving data from or transmitting data to only one of those sub-arrays at a given time.

In the memory device 10 shown in FIG. 1, both sub-arrays 12a and 12b are accessed simultaneously, so each sub-array 12a, 12b provides one bit of a data word. Both sub-arrays 12a and 12b receive the row and column addresses simultaneously. The data bit stored by the memory cell accessed in the sub-array 12b will be provided to the I/O line 52 primarily associated with the sub-array 12b. Concurrently, the data bit stored by the corresponding memory cell in sub-array 12a will be provided to the I/O line 50. However, as a person of ordinary skill will appreciate, some or all of the principles of the present invention may be applied to a memory device where the sub-arrays 12a and 12b are not accessed simultaneously.

As mentioned previously, redundant memory is mapped to an address of defective memory cells during testing of the memory device 10. During testing, defective memory cells are replaced initially by the redundant memory associated with the memory sub-array 12a or 12b in which the defective memory cell is located. However, if it is determined that the redundant memory required to repair all of the defective memory cells in the sub-array exceeds the number of redundant rows or the number of redundant columns located in that memory sub-array, unused redundant memory located in another memory sub-array will be mapped to the address of any additional defective memory cells. The unused redundant memory is mapped by programming the address of the defective cell into the fuse bank 24, 30 associated with the sub-array having the unused redundant memory. Additionally, the fuse bank must be programmed to map the redundant memory to the appropriate sub-array. This may be accomplished by programming an additional fuse associated with each redundancy memory to indicate whether the redundant memory is to be mapped to a location within the sub-array, or to a location in another sub-array.

In operation, an incoming row address is provided by a row address latch (not shown) to the row fuse banks 24a, 24b. Each row fuse bank 24a and 24b compares the incoming row address to the redundant row addresses programmed in the row fuse banks 24a, 24b. The redundant addresses are the row addresses of primary memory 14a, 14b that have been replaced by redundant rows of memory. If the row fuse banks 24a, 24b do not detect an address match, the row address decoders 26a and 26b will access the rows of memory corresponding to the row address provided by the row address latch in the primary memory portion 14a, 14b. If the incoming row address matches one of the programmed redundant row addresses, a MATCH signal will be generated by the fuse bank 24a or 24b detecting the address match and provided to the associated row decoder 26a or 26b. In response, the associated row address decoder 26a or 26b accesses the redundant row mapped to the current row address, and ignores the defective row in the primary memory portion of the sub-array.

When a row of memory is accessed, all of the memory cells associated with that row are activated in the sub-array, and the data bits stored in those memory cells are amplified by the sense amplifiers 34a, 34b of the memory sub-arrays 12a and 12b. One of the cells associated with the accessed row is then selected based on an incoming column address.

A column address latch (not shown) provides the incoming column address to the column fuse banks 30a and 30b. As with the row fuse banks 24a and 24b, the column fuse banks 30a and 30b compare the incoming column address to the redundant column addresses programmed during testing of the memory device. If the incoming column address does not match any of the programmed redundant addresses, the column corresponding to the incoming column address will be accessed. The data bit stored by the memory cell at the intersection of the current row and column addresses is the coupled through the column decoders 32a, 32b to the I/O line primarily associated with the sub-array.

In the case where the address provided to the fuse banks 30a and 30b matches one of the programmed redundant addresses, the respective fuse bank generates a MATCH signal and provides it to the respective column decoder 32a or 32b. The column fuse banks 30a and 30b also provide the isolation signals, ISOA and ISOB, respectively, to the control circuit 44. As mentioned previously, each redundant column has a set of programmable fuses for programming the address and whether the address is located within the sub-array, or in another sub-array that typically has redundant elements specific to that group of sub-arrays. The ISOA generated by the column fuse block 30a will be high when the programmed redundant column of the sub-array 12a is mapped to the sub-array 12b. Similarly, the ISOB signal will be high when the programmed redundant column of the sub-array 12b is mapped to the sub-array 12a. Otherwise, the ISOA and ISOB signals will remain low during an access operation.

Based on the MATCH signal, the column decoder selects the redundant column having a programmed address that matches the current column address. The control circuit 44 activates the isolation circuit 40a or 40b of the sub-array in which the redundant memory column is located based on the state of the ISOA or ISOB signals received from the column fuse banks 30a or 30b that detected a matching address. The redundant memory column is coupled through the isolation circuit 40a or 40b to the I/O line 50 if the redundant column is mapped to a defective location in sub-array 12a, or to the I/O line 52 if the redundant column is mapped to a defective location in sub-array 12b.

For example, assume that a defective column of memory cells located in the memory sub-array 12b has been repaired by using a redundant column located in the sub-array 12a. Further assume that the defective column of memory cells is currently being accessed during a read operation. Initially, a row of memory corresponding to the current row address received by the row fuse banks 26a and 26b is accessed as previously described. All the memory cells associated with the selected row, in both of the sub-arrays 12a and 12b, are activated and have the respective data amplified by the respective sense amplifiers 34a and 34b. The column address of the defective column of memory cells in the sub-array 12b is then provided to both the column fuse banks 30a and 30b. The column fuse bank 30a detects that the current column address matches one of its programmed addresses and generates a MATCH signal for the column decoder 32a. The column fuse bank 30a also provides a high ISOA signal to the control circuit 44. The ISOA signal provided by the column fuse bank 30a is high to indicate that the memory device had been programmed during testing to map the redundant column located in the sub-array 12a to the address of the defective column of memory cells located in the sub-array 12b.

The column decoder 32a receives the MATCH signal from the column fuse bank 30a and selects the redundant column of memory that has been mapped to the defective location in the sub-array 12b. The column decoder 32a also selects the column of memory that is selected during the normal course of the read operation. That is, the column decoder 32a must select both the column that would normally be accessed to provide a data bit from the sub-array 12a, and also the redundant column that has been mapped to the address of the defective cell located in sub-array 12b.

In response to receiving the high ISOA signal from the column fuse bank 30a, the control circuit 44 generates an ENABLEA signal to activate the isolation circuit 40a to couple the selected redundant column memory to the I/O line 52, that is, the I/O line primarily associated with the sub-array 12b. The column selected corresponding to the current column address for the sub-array 12a is coupled by the column decoder 32a to the I/O line 50, that is, the I/O line primarily associated with the sub-array 12a. Thus, the fact that a redundant column of memory in sub-array 12a has been mapped to a defective location in the sub-array 12b will appear transparent to the rest of the memory device.

Although the operation of the memory device has been described with respect to a read operation, a write operation is similarly performed. That is, the redundant column of the sub-array 12a would be coupled through the isolation circuit 40a to the I/O line 52 and the normally accessed column would simultaneously be coupled through the column decoder 32a to the I/O line 50.

Figure 2:
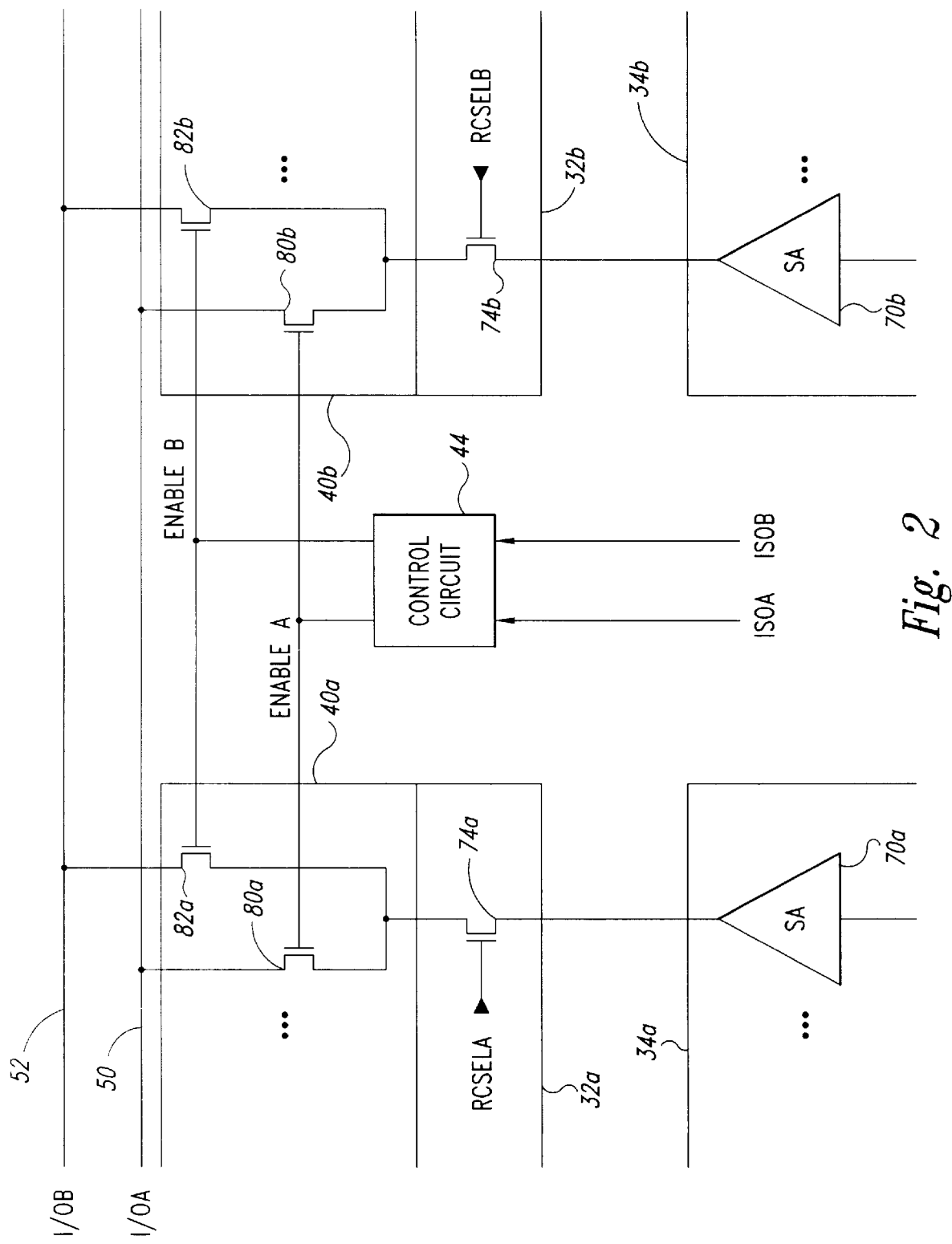
FIG. 2 is a schematic diagram of a portion of an isolation circuit that may be used in the embodiment of the present invention.

FIG. 2 illustrates an embodiment of an isolation circuit 40 that may be used as shown in FIG. 1. A sense amplifier 70a of a redundant column memory 18a is coupled to the I/O lines 50 and 52 through a redundant column switch 74a of the column decoder 32a, and two switches 80a and 82a. Similarly, a sense amplifier 70b of a redundant column memory 18b is coupled to I/O lines 50 and 52 through a redundant column switch 74b of the column decoder 32b, and switches 80b and 82b. As a person of ordinary skill in the art will appreciate, the sense amplifiers 70a and 70b are representative of a plurality of sense amplifiers of the redundant column memory 18a and 18b that are coupled to the I/O lines 50 and 52 in a similar manner. The switches 80a, 80b and 82a, 82b have control terminals coupled to the control circuit 44 so that the control circuit 44 can selectively couple the redundant columns to either the I/O line 50 or 52, depending on whether a particular redundant column has been mapped to an location within the same sub-array, or mapped to a location in another sub-array.

Returning to the prior example where a redundant column of the sub-array 12a has been mapped to a defective location in the sub-array 12b, the redundant column switch 74a is activated when the column decoder 32a generates a RCSELA signal in response to receiving a MATCH from the column fuse bank 30a. The control circuit 44 will then generate an ENABLEB signal in response to receiving the ISOA signal from the column fuse bank 30a and activate the switches 82a, 82b in order to couple the sense amplifier 70a to I/O line 52, that is, the I/O line primarily associated with the memory sub-array 12b. Although the switch 82b will also be activated by the ENABLEB signal, the sense amplifier 70b will not be coupled to the I/O line 52 because the redundant column switch 74b remains deactivated.

In the case where a redundant column memory located in the sub-array 12a has been mapped to an address location in the same sub-array 12a, the redundant column switch 74a is again activated by the column decoder 32a in response to receiving the MATCH signal. However, the control circuit 44 will generate an ENABLEA signal instead of an ENABLEB signal because the column fuse bank 30a is programmed to keep the ISOA signal low when the particular address had been detected.

Figure 3:
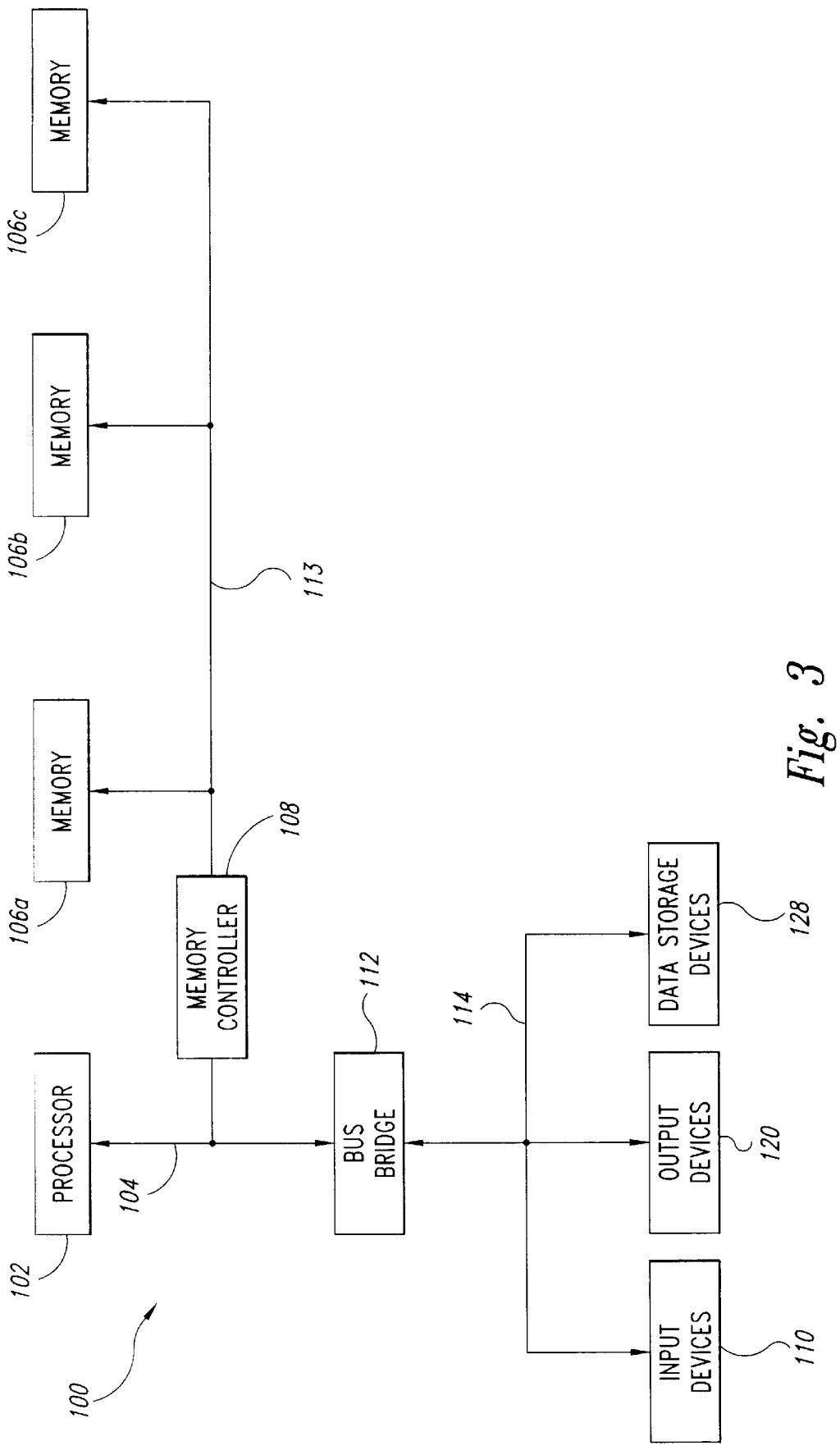
FIG. 3 is a block diagram of a computer system that includes a plurality of the memory devices shown in FIG. 1.

Shown in FIG. 3 is an example of a computer system 100 that includes a plurality of memory devices 106a–c of FIG. 1. The computer system 100 includes a processor 102 having a processor bus 104 coupled through a memory controller 108 and system memory bus 113 to three memory devices 106a–c. The computer system 100 also includes one or more input devices 110, such as a keypad or a mouse, coupled to the processor 102 through a bus bridge 112 and an expansion bus 114, such as an industry standard architecture ("ISA") bus or a peripheral component interconnect ("PCI") bus. The input devices 110 allow an operator or an electronic device to input data to the computer system 100. One or more output devices 120 are coupled to the processor 102 to display or otherwise output data generated by the processor 102. The output devices 120 are coupled to the processor 102 through the expansion bus 114, bus bridge 112 and processor bus 104. Examples of output devices 114 include printers and a video display units. One or more data storage devices 128 are coupled to the processor 102 through the processor bus 104, bus bridge 112, and expansion bus 114 to store data in or retrieve data from storage media (not shown). Examples of storage devices 128 and storage media include fixed disk drives floppy disk drives, tape cassettes and compact-disk read-only memory drives.

In operation, the processor 102 sends a data transfer command via the processor bus 104 to the memory controller 108, which, in turn, communicates with the memory devices 106a–c via the system memory bus 123 by sending the memory devices 106a–c control and address information. Data is coupled between the memory controller 108 and the memory devices 106a–c through a data bus portion of the system memory bus 113. During a read operation, data is transferred from the memory devices 106a–c over the memory bus 113 to the memory controller 108 which, in turn, transfers the data over the processor bus 104 to the processor 102. The processor 102 transfers write data over the processor bus 104 to the memory controller 108 which, in turn, transfers the write data over the system memory bus 113 to the memory devices 106a–c. Although all the memory devices 106a–c are coupled to the same conductors of the system memory bus 113, only one memory device 106a–c at a time reads or writes data, thus avoiding bus contention on the memory bus 113. The computer system 100 also includes a number of other components and signal lines that have been omitted from FIG. 3 in the interests of brevity.

From the foregoing it will be appreciated that, although specific embodiments of the invention have been described herein for purposes of illustration, various modifications may be made without deviating from the spirit and scope of the invention. For example, the memory device 10 has been described as having two I/O lines 50, 52 coupled to each of the memory sub-arrays 12a and 12b. However, the number of I/O lines coupled to each sub-array 12a, 12b may be increased so that more than one column of each sub-array 12a, 12b may be accessed during each access cycle. Furthermore, the memory device 10 has been described as having two memory sub-arrays 12a and 12b that are able to share redundant memory. However, the number of memory sub-arrays that can share unused redundant memory may include any number of memory sub-arrays, and is not limited to two. Accordingly, the invention is not limited except as by the appended claims.

What is claimed is:

1. A semiconductor memory device having an array of memory cells divided into a plurality of sub-arrays of memory cells arranged into rows and columns, each sub-array having a limited number of associated redundant memory cells arranged into rows and columns, and primarily for repairing defective memory cells within the respective sub-array, the semiconductor memory device comprising:

first and second I/O lines;

first and second plurality of switches coupled to the first and second I/O lines and to the redundant memory cells of first and second sub-arrays, all respectively, each switch having a control terminal; and a control circuit coupled to the control terminals of each switch and adapted to couple the memory cells of the redundant area of the second sub-array to the first I/O line when a memory cell of the first sub-array is being accessed.

2. The memory device of claim 1, further comprising:

a row decoder coupled to the selected one of the plurality of sub-arrays, the row decoder adapted to access the redundant rows of memory cells of the selected one of the plurality of sub-arrays; and a row fuse bank coupled to the row decoder and coupled to receive a row address, the row fuse bank having programmable elements programmed with row addresses to which the redundant rows of memory cells are mapped.

3. The memory device of claim 1, further comprising:

a column decoder coupled to the selected one of the plurality of sub-arrays, the column decoder adapted to access the redundant columns of memory cells of the selected one of the plurality of sub-arrays; and a column fuse bank coupled to the column decoder and coupled to receive a column address, the column fuse bank having programmable elements programmed with column addresses to which the redundant columns of memory are mapped.

4. The memory device of claim 1 wherein the control circuit is adapted to couple redundant memory cells of the second sub-array to the first I/O line when the memory cell of the first sub-array being accessed is defective and the predetermined number of redundant memory cells of the first sub-array has been depleted.

5. The memory device of claim 1 wherein the first and second I/O lines comprise complementary pairs of I/O lines.

6. A semiconductor memory device having an array of memory cells divided into sub-arrays of memory cells arranged into rows and columns, the semiconductor memory device comprising:

first and second I/O lines:

first and second sub-arrays of memory cells, each having a predetermined number of redundant memory cells located in a respective redundant memory area associated with the respective sub-array coupled to the first and second I/O lines through respective switches, the redundant memory cells for primarily replacing defective memory cells in the respective sub-array; and a control circuit coupled to the respective switches to couple memory cells of the redundant area of the second sub-array to the first I/O line when a memory cell of the first sub-array is being accessed.

7. The memory device of claim 6 wherein the control circuit is adapted to couple redundant memory cells of the second sub-array to the first I/O line when the memory cell of the first sub-array being accessed is defective and the predetermined number of redundant memory cells of the first sub-array have been depleted.

8. The memory device of claim 6 wherein the control circuit is adapted to couple redundant memory cells of the second sub-array to the first I/O line when the memory cell of the first sub-array being accessed is defective and the predetermined number of redundant memory cells of the first sub-array have been depleted, and the redundant memory cells in the redundant memory are arranged into redundant rows and columns of memory cells.

9. The memory device of claim 6 wherein the control circuit is adapted to couple redundant memory cells of the second sub-array to the first I/O line when the memory cell of the first sub-array being accessed is defective and the predetermined number of redundant memory cells of the first sub-array have been depleted, and the redundant memory cells in the redundant memory are arranged into redundant rows and columns of memory cells, the redundant rows replace a row in a respective sub-array having a defective memory cell and the redundant columns replace a column in the respective sub-array having a defective memory cell.

10. The memory device of claim 6, further comprising:
    first and second row decoders coupled to the first and second sub-arrays, respectively, to access the rows of redundant memory cells of the respective sub-array, the first and second row decoders further coupled to the control circuit to selectively access the rows of redundant memory cells; and
    first and second row fuse banks coupled to the first and second row decoders, respectively, each fuse bank having fuseable devices for programming row addresses to which the rows of redundant memory are mapped.

11. The memory device of claim 6, further comprising:
    first and second column decoders coupled to the first and second sub-arrays, respectively, to access the columns of redundant memory cells of the respective sub-array, the first and second column decoders further coupled to the control circuit to selectively access the columns of redundant memory cells; and
    first and second column fuse banks coupled to the first and second row decoders, respectively, each fuse bank having fuseable devices for programming column addresses to which the columns of redundant memory are mapped.

12. The semiconductor memory device of claim 6 wherein the first and second I/O lines comprise complementary pairs of I/O lines.

13. A semiconductor memory device, comprising:
    first and second sub-arrays of memory cells, each sub-array having primary memory cells and a predetermined number of redundant memory cells arranged into rows of word lines and columns of digit lines;
    first and second I/O lines, each I/O line primarily associated with a respective sub-array of memory cells;
    a plurality of switches coupled between the digit lines and the first and second I/O lines, each switch of the plurality having a control terminals;
    a control circuit coupled to the control terminal of each switch of the plurality, the control circuit accessing the redundant memory cells of the second sub-array and coupling the accessed redundant memory cells to the first I/O line when a primary memory cell of the first sub-array is being accessed.

14. The memory device of claim 13, further comprising:
    first and second row address decoders coupled to a respective sub-array to access the rows of redundant memory cells of the respective sub-array; and
    first and second row fuse banks coupled to the first and second row address decoders, respectively, each row fuse bank programmed with addresses to which the rows of redundant memory cells of the respective sub-array are mapped.

15. The memory device of claim 13, further comprising:
    first and second column address decoders coupled to a respective sub-array to access the columns of redundant memory cells of the respective sub-array; and
    first and second column fuse banks coupled to the first and second column address decoders, respectively, each column fuse bank programmed with addresses to which the columns of redundant memory cells of the respective sub-array are mapped.

16. The semiconductor memory device of claim 13 wherein the first and second I/O lines comprise complementary pairs of I/O lines.

17. A computer system, comprising:
    a processor having a processor bus;
    an input device coupled to the processor and adapted to allow data to be entered into the computer system;
    an output device coupled to the processor and adapted to allow data to be output from the computer system; and
    a memory device coupled to the processor through the processor bus, the memory device having an array of memory cells divided into a plurality of sub-arrays of memory cells arranged into rows and columns, the memory device comprising:
        first and second I/O lines;
        first and second sub-arrays of memory cells, each having a predetermined number of redundant memory cells located in a respective redundant memory area associated with a respective sub-array coupled to the first and second I/O lines through respective switches, the redundant memory cells for primarily replacing defective memory cells in the respective sub-array; and
        a control circuit coupled to the respective switches to couple memory cells of the redundant area of the second sub-array to the first I/O line when a memory cell of the first sub-array is being accessed.

18. The computer system of claim 17 wherein the control circuit is adapted to couple redundant memory cells of the second sub-array to the first I/O line when the memory cell of the first sub-array being accessed is defective and the predetermined number of redundant memory cells of the first sub-array have been depleted.

19. The computer system of claim 17 wherein the control circuit is adapted to couple redundant memory cells of the second sub-array to the first I/O line when the memory cell of the first sub-array being accessed is defective and the predetermined number of redundant memory cells of the first sub-array have been depleted, and the redundant memory cells in the redundant memory are arranged into redundant rows and columns of memory cells.

20. The computer system of claim 17 wherein the control circuit is adapted to couple redundant memory cells of the second sub-array to the first I/O line when the memory cell of the first sub-array being accessed is defective and the predetermined number of redundant memory cells of the first sub-array have been depleted, and the redundant memory cells in the redundant memory are arranged into redundant rows and columns of memory cells, the redundant rows replace a row in a respective sub-array having a defective memory cell and the redundant columns replace a column in the respective sub-array having a defective memory cell.

21. The computer system of claim 17, further comprising:
    first and second row decoders coupled to the first and second sub-arrays, respectively, to access the rows of redundant memory cells of the respective sub-array, the first and second row decoders further coupled to the control circuit to selectively access the rows of redundant memory cells; and first and second row fuse banks coupled to the first and second row decoders, respectively, each fuse bank having fuseable devices for programming row addresses to which the rows of redundant memory are mapped.

22. The computer system of claim 17, further comprising:

first and second column decoders coupled to the first and second sub-arrays, respectively, to access the columns of redundant memory cells of the respective sub-array, the first and second column decoders further coupled to the control circuit to selectively access the columns of redundant memory cells; and first and second column fuse banks coupled to the first and second row decoders, respectively, each fuse bank having fuseable devices for programming column addresses to which the columns of redundant memory are mapped.

23. The computer system of claim 17 wherein the I/O lines comprise complementary pairs of I/O lines.

24. A method of replacing defective memory cells in a semiconductor memory device having an array of memory cells divided into memory cell sub-arrays arranged into rows and columns, each sub array having a predetermined number of redundant memory cells associated with the respective sub-array, the method comprising:

accessing the redundant memory cells of a first memory cell sub-array coupled to a first I/O line when a defective memory cell of a second memory cell sub-array coupled to a second I/O line is accessed; and coupling the accessed redundant memory cells of the first memory cell sub-array to the I/O line coupled to the second memory cell sub-array.

25. The method of claim 24 wherein coupling comprises closing a switch coupled between the I/O line primarily associated with the second memory cell sub-array and the memory cells.

26. The method of claim 24 wherein the I/O line comprises a complementary pair of I/O lines.

27. A method of repairing a semiconductor memory device having an array of memory cells divided into memory cell sub-arrays arranged into rows and columns, each sub-array having a predetermined number of redundant memory cells associated with the respective sub-array for replacing defective memory cells of the respective sub-array coupled to a respective I/O line, the method comprising:

coupling a redundant memory cell in a first memory cell sub-array to the I/O line coupled to a second memory cell sub-array when a defective memory cell in the second memory cell sub-array is accessed.

28. The method of claim 27 wherein coupling comprises closing a switch coupled between the I/O line primarily associated with the second memory cell sub-array and the memory cells.

\* \* \* \* \*